(12) United States Patent
Schliep et al.

(10) Patent No.: US 6,710,544 B2
(45) Date of Patent: Mar. 23, 2004

(54) REFLECTOR-CONTAINING SEMICONDUCTOR COMPONENT

(75) Inventors: Karl-Peter Schliep, München (DE); Norbert Wagner, Munich (DE)

(73) Assignee: Patent-Treuhand-Gesellschaft für elektrische Glühiampen mbH, München (DE)

( * ) Notice: Subject to any disclaimer, the term of this patent is extended or adjusted under 35 U.S.C. 154(b) by 0 days.

(21) Appl. No.: 10/060,584

(22) Filed: Jan. 30, 2002

(65) Prior Publication Data

US 2002/0105268 A1 Aug. 8, 2002

(30) Foreign Application Priority Data

Feb. 7, 2001 (DE) .......................... 101 05 802

(51) Int. Cl.⁷ ................................ H01J 63/04
(52) U.S. Cl. ..................................... 313/512
(58) Field of Search ................ 313/498, 501, 313/502, 512

(56) References Cited

U.S. PATENT DOCUMENTS

| 4,603,496 A | * | 8/1986 | Latz et al. ............... 40/547 |
| 5,742,120 A | * | 4/1998 | Lin ....................... 313/512 |
| 5,813,753 A | | 9/1998 | Vriens et al. |
| 6,469,322 B1 | * | 10/2002 | Srivastava et al. ........ 257/89 |

FOREIGN PATENT DOCUMENTS

| DE | 198 07 758 | 12/1998 |
| DE | 100 06 738 | 9/2001 |
| WO | WO 97/50132 | 12/1997 |

* cited by examiner

*Primary Examiner*—Sandra O'Shea
*Assistant Examiner*—Sumati Krishnan
(74) *Attorney, Agent, or Firm*—Cohen, Pontani, Lieberman & Pavane

(57) ABSTRACT

A reflector-containing semiconductor component (21) which comprises a radiation-emitting LED (22) is seated in a housing which comprises at least one base part (30) and a reflector (23) for the radiation from the LED, the LED (22) being fastened on a platform (25) in the vertex of the reflector.

13 Claims, 5 Drawing Sheets

REFLECTOR-CONTAINING SEMICONDUCTOR COMPONENT

FIELD OF THE INVENTION

The invention relates to a reflector-containing semiconductor component. This is, in particular, an LED chip which is seated in a reflector.

BACKGROUND OF THE INVENTION

A reflector-containing semiconductor component is known from WO 97/50132. The LED is fastened directly on the base of the reflector. The reflector contour is frustoconical. A further reflector-containing semiconductor component is known from U.S. Pat. No. 5,813,753. The vertex region in which the chip is seated is planar. The contour has a curved region which predominantly reflects the radiation.

DE-A 100 06 738 (not yet laid open) and DE-A 198 07 758 disclose a semiconductor component in which the side surfaces of the chip are located obliquely in relation to the top and base surfaces thereof. As a result, the coupling out of light is indeed improved, but without being particularly useful in a reflector.

SUMMARY OF THE INVENTION

One object of the present invention is to provide a reflector-containing semiconductor component which improves the coupling out of light in the forward direction.

This and other objects are attained in accordance with one aspect of the invention directed to a reflector-containing semiconductor component which comprises at least one radiation-emitting LED, in particular on a chip. The chip is seated in a housing which includes a reflector for deflecting radiation from the LED. The LED is fastened on a platform in the vertex of the reflector.

In specific terms, the invention relates to a reflector-containing semiconductor element which comprises a radiation-emitting LED which is seated in a housing, the housing comprising at least one base part and a reflector for the radiation from the LED, the LED being connected to the vertex of the reflector, possibly realized by a rectilinear base plate, via a platform, that is to say it is seated in a raised state in the vertex. The LED emits, in particular, in the visible radiation range, but also in the UV or IR range, and may be realized, for example, by an InGaN LED. The reflector may be an integral constituent part of the base part or, for example, a component which is positioned thereon or is contained centrally therein. The LED is seated centrally in the reflector vertex in the axis of the reflector. The contour of the reflector may be adapted to different purposes, in particular it is possible for the vertex to be formed by a separate vertex component. This may be, for example, a base plate or the covering of the base part. This concept also makes it possible for a non-forwardly directed light radiation from the LED to be collected effectively in the reflector and thus for the overall luminous flux to be increased.

Overall, it is possible for the arrangement according to the invention to reduce the solid-angle fraction in the reflector which cannot be utilized. This reduces the vignetting, which normally causes considerable disruption since, up until now, it has not been possible for the chip and reflector to be coordinated with one another. With dimensions of a few hundred $\mu$m, the chips were relatively large for the reflector, which typically had a diameter at its opening of approximately 1 to 2 mm. The diameter and depth of the reflector are frequently determined by external constraints, while, on the other hand, the dimensions of the chip cannot be varied as desired by the manufacturer. On account of the degree of freedom achieved by the platform, it is now possible to use, as the reflector, for example a parabola with optimal focal length, that is to say longer than before. Even in the case of a relatively large reflector opening, uniform radiation is still achieved.

The novel concept is also advantageous when used on an array of LEDs. It is possible here, while maintaining the same overall height, for a predetermined surface for an array to be fitted considerably more effectively with semiconductor components since the spacing between the individual semiconductor components can be increased because the reflector opening can be increased. It is possible, in particular, for the array to be illuminated more uniformly.

It is often the case that the LED has in each case a rectangular base surface and top surface, the top surface of the LED being oriented in the direction of the opening of the reflector.

A particularly preferred LED is one which tapers downward, in the direction of the vertex. In particular the overall area of the base surface is smaller than that of the top surface. In this case, a considerable amount of the radiation emitted by the LED is radiated laterally or downwardly and would either escape from the reflector in an undirected manner as stray light or be absorbed in the region of the vertex, possibly by the LED. By virtue of the platform being used, it is possible for more light to be utilized effectively and for the reflector and LED to be coordinated optimally with one another, with the result that the effective light flux can be increased to a considerable extent, in particular by approximately 10 to 80%, depending on the actual configuration. It should be taken into consideration, in particular, that the LED, in each case, has to be fastened in the vertex, usually by means of an adhesive. The raised position of the LED then prevents the adhesive from flowing out into the effective reflector surface. Moreover, the LED itself absorbs less light which is radiated back by the reflector contour. The additional degree of freedom of the arrangement according to the invention makes it possible for the desired radiation characteristics to be optimized precisely. It is then possible, for example, for the LED to be positioned precisely at the focal point of a reflector contour (parabola or ellipse).

Added to this is a further essential consideration, namely that the height of the LED influences the ohmic resistance thereof. Any desired extension of this height thus involves considerable disadvantages. A height range of not more than 300 $\mu$m is preferred since, in this case, the ohmic resistance is relatively low. In this way, it is then also possible to limit the power loss.

The platform may be realized in two embodiments: either as a separate component or as an integral constituent part of the underlying surface. In the former case, the platform may be optimized as far as the nature of its material and its configuration are concerned, and in the second case the additional production step and the adjusting process for the platform are dispensed with, but the material is determined by the underlying surface, generally the vertex component or the reflector. The separate platform is produced by the platform being punched out of a metal strip (made of copper or the like) of the desired thickness and then being introduced into the reflector—before the chip is introduced—by means of electrically conductive adhesive. This method is suitable for an approximately cubic platform. In the case of a considerably extended height, the use of a bar, from which the platform is cut off, is recommended.

The radiation characteristics may be further improved in that the LED is protected by a covering acting as a lens, the reflector geometry and the lens geometry being coordinated with one another.

A separate platform may consist, in particular, of material which is a good heat conductor, for example a metal such as copper, with the result that overheating of the chip is avoided even under high loading. The production of an integral platform can be achieved by milling the underlying surface (e.g. reflector body).

The platform is advantageously configured as a round or rectangular plate with a height of approximately 100 to 500 μm. It is possible, in particular, for the base surface of the platform to be adapted to that of the LED.

As the material for connecting the platform and the housing and also the chip and the platform, it is possible to use an adhesive, in particular the same adhesive, in each case. This adhesive can pass out of the boundary surface, which is to be taken as an indication that sufficient adhesive has been apportioned. It should also be ensured here, however, that the adhesive covers, in particular, not more than a third of the height of the chip.

The reflector may have a contour which corresponds, or is at least similar, to the shape of a parabola, ellipse or sphere. It is possible for the planar attachment surface of the platform to be aligned by the adhesive with the curved surface in the vertex region. It is also possible for the reflector contour simply to be in the form of a trough or only partially to be in the shape of a conic section. The underlying surface of the platform may either be formed by the vertex region of the reflector body or be a separate component with, in particular, a different contour from the actual reflector, it being possible for said vertex component to be configured, in particular, as a planar base surface.

It is thus possible for the position of the chip to be adjusted optimally by the interaction of the platform and chip.

The platform and chip should be coordinated with one another as far as possible, preferably by the size of the contact surface of the platform corresponding approximately to the size of the base surface of the chip, in which case the two surfaces should differ, at most, by not more than 50%, and preferably 30%. A rectangular chip may thus be seated on a round platform with approximately the same diagonal as the edge length of the chip. In the case of an identical cubic configuration, the edge length of the platform should be not more than 20% longer than that of the chip. The adhesive is advantageously electrically conductive and thus produces the connection between the chip and power supply. In the case of a contact surface of approximately the same size, some adhesive always flows out and this makes it easily possible for the apportioning of the adhesive to be monitored. If, for safety reasons, much too much adhesive is selected, this runs down the platform and hardens on the side surfaces thereof, that is to say without reducing the reflector surface area and disrupting the radiation of light.

DETAILED DESCRIPTION OF THE DRAWINGS

Figure 1:
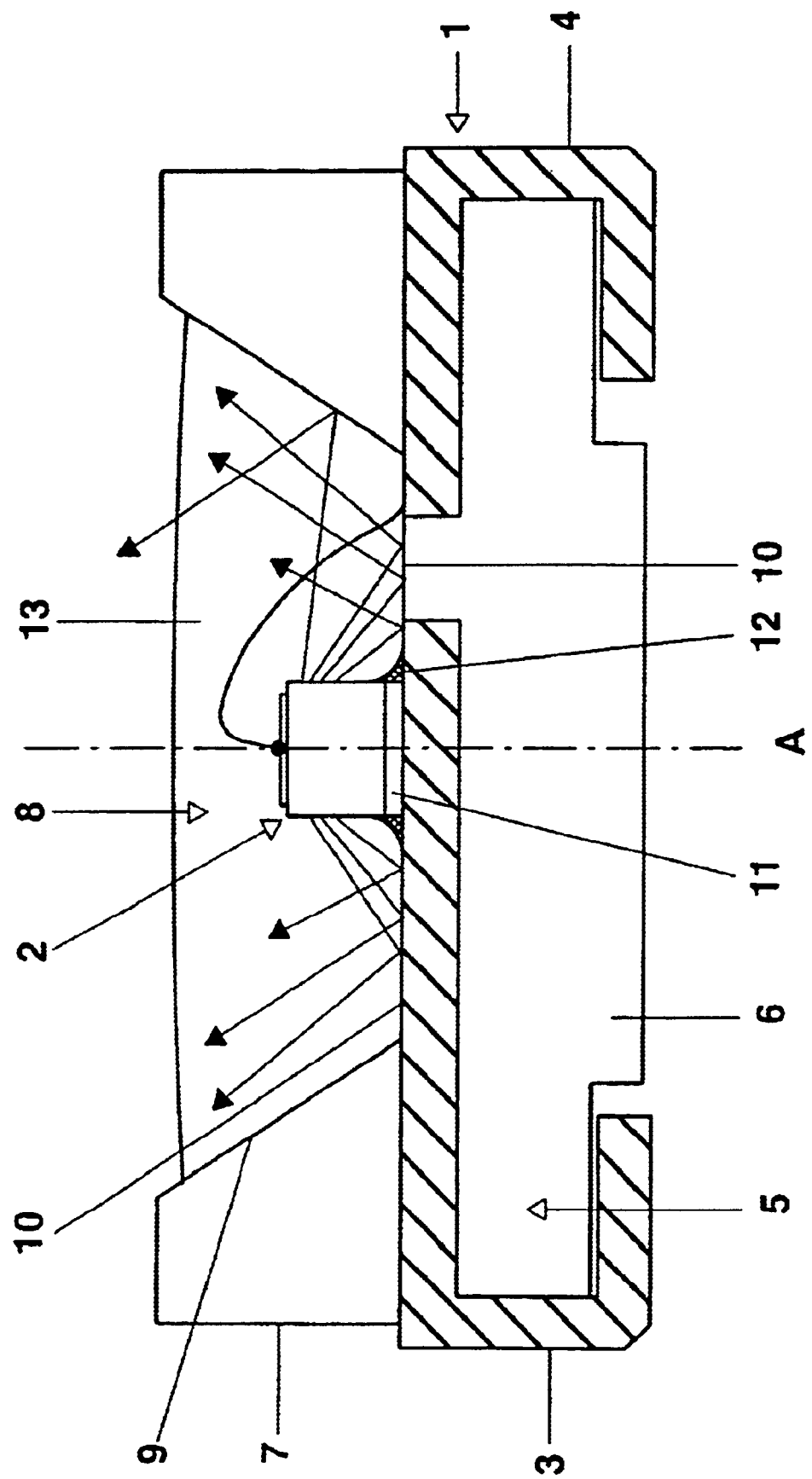
FIG. 1 shows a semiconductor component with reflector.

The construction of a typical semiconductor component with reflector is illustrated in FIG. 1. In this case, it is a light source for white light. The semiconductor component 1 comprises an LED 2 (chip) of the InGaN type with peak emission wavelength of 465 nm with a first and second electrical connection 3, 4. The LED, which has a square base surface, is embedded in a light-impermeable housing 5. The latter comprises a base part 6 which is of rectangular configuration and against which the connections 3,4 butt. Seated on the base part is a square reflector body 7 with a central cutout 8. The contour 9 of the reflector is tapered frustoconically in the direction of the base part 6. The LED is seated centrally in the vertex of the reflector, on the reflector axis A. The planar surface of the base part 6 acts as a separate vertex component 10. It is also possible, however, to use, as the vertex component, a separate base plate which reflects particularly well. The chip 2 has dimensions of approximately 200 μm×200 μm and a height of 250 μm. It is seated precisely on a platform 11 which has the same dimensions as the chip, with an overall height of 150 μm. The platform is cut out of a copper sheet. An electrically conductive epoxy adhesive 12 connects the vertex component to the platform and connects the latter to the chip. The cutout 8 is filled with a sealing compound 13, the main constituent parts of which are an epoxy casting resin and fluorescent pigments. The primary radiation of the LED 2 is in a forward direction toward the reflector opening. A fraction of the radiation, however, is also directed laterally or to the rear (arrows) and, finally, is reflected forward by the reflector. On its way through the sealing compound, the primary radiation is partially converted by the fluorescent pigments into radiation of a longer wavelength. The platform 11 extends the path of the radiation in the sealing compound and reduces the vignetting.

Figure 2:
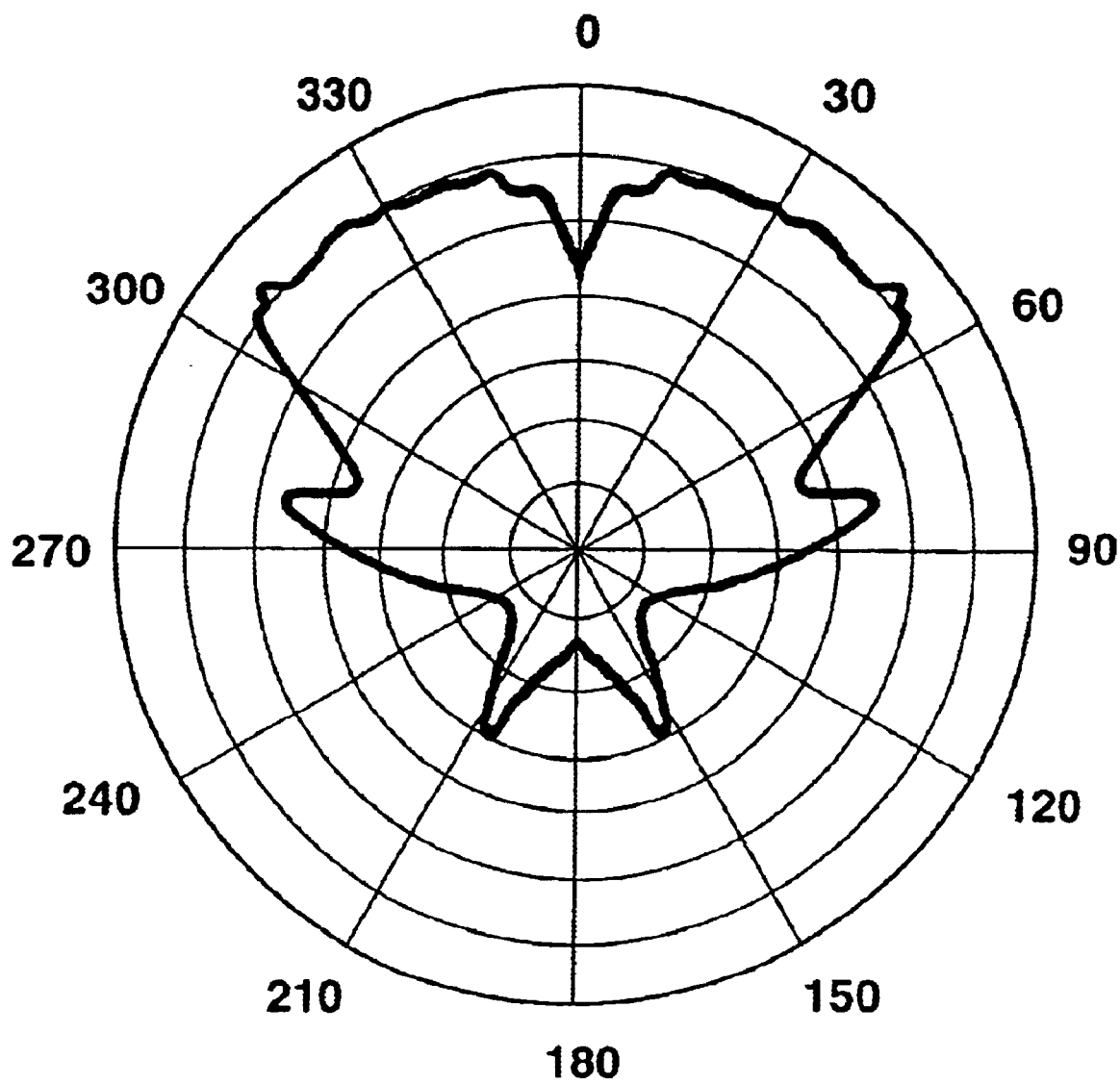
FIG. 2 shows the radiation characteristics of such a chip.

FIG. 2 shows the radiation characteristics of such a cubic chip (without reflector). The main radiation takes place in the forward direction in a range between approximately 10 and 45°. A small amount is radiated laterally and to the rear. It is now better utilized by way of the platform. The light flux is thus raised by approximately 5 to 10%.

Figure 3:
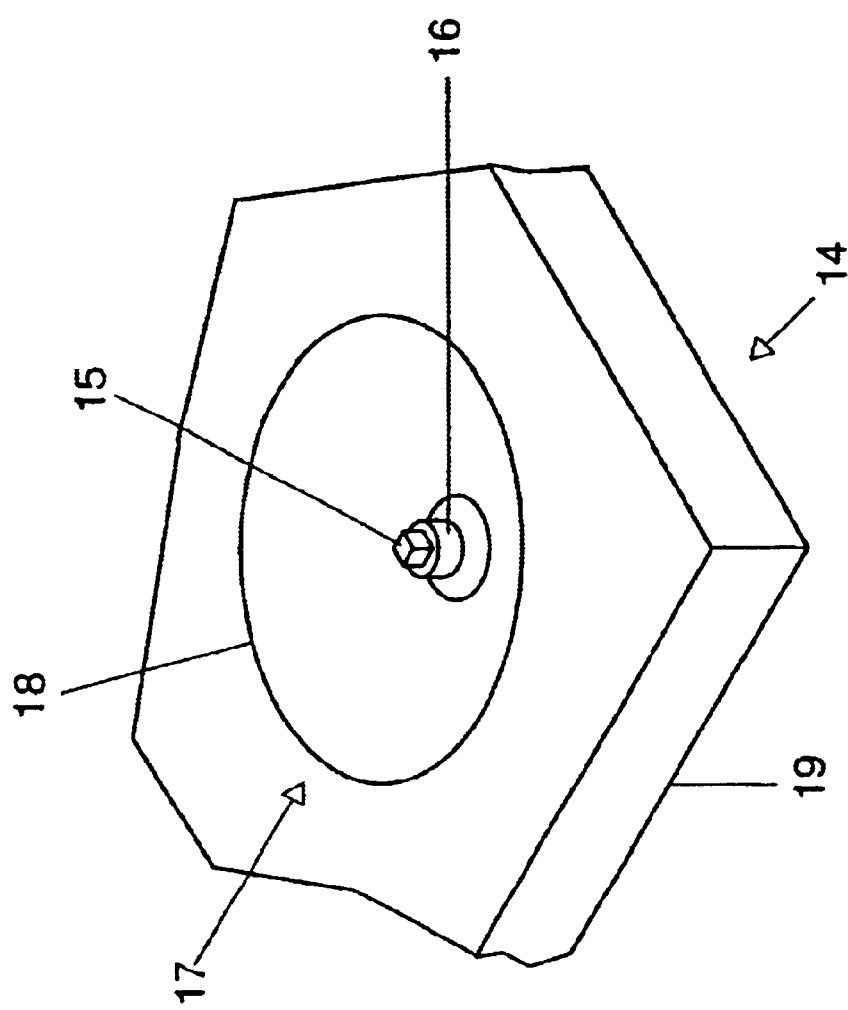
FIG. 3 shows a further exemplary embodiment of a semiconductor component with reflector.
Figure 3:
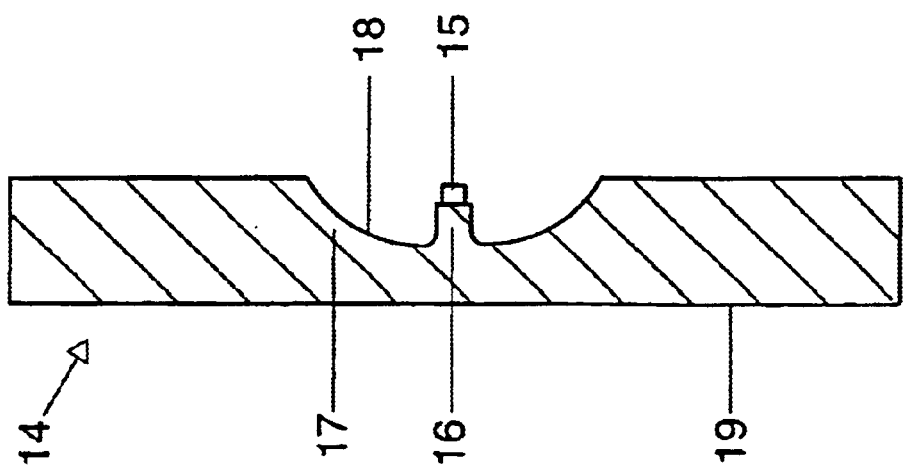

FIG. 3 shows an exemplary embodiment of a semiconductor component 14 with a platform integrated in the reflector. A rectangular LED 15 is seated in the vertex of the reflector on a round (or frustoconical) platform 16, of which the contact surface is somewhat larger. The platform 16 is part of a reflector body 17 which is of parabolic contour 18 throughout. The reflector body 17 forms a unit with the base part 19.

Figure 4:
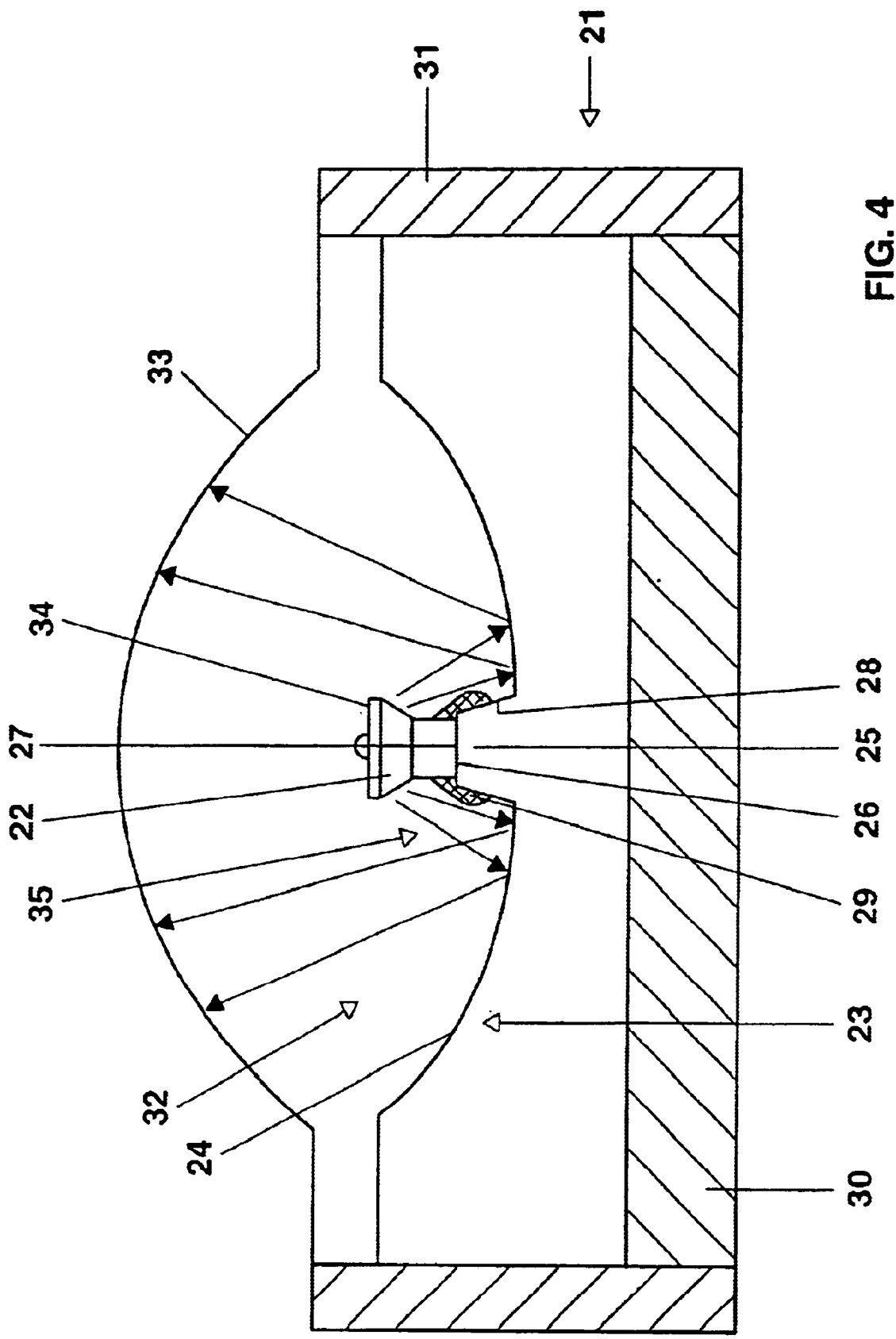
FIG. 4 shows a further exemplary embodiment of a semiconductor component with reflector.
Figure 5:
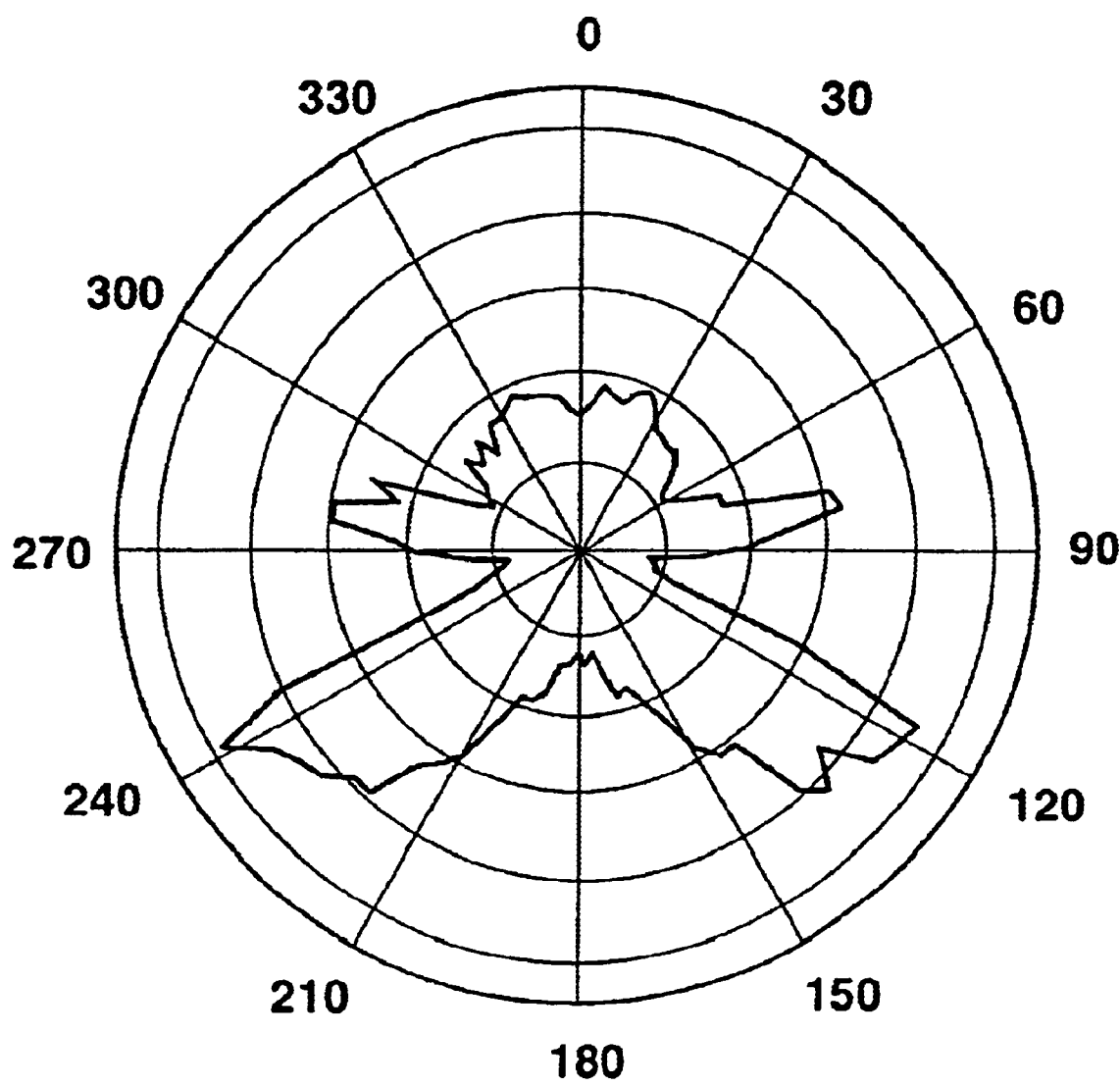
FIG. 5 shows the radiation characteristics of the chip utilized in FIG. 4.

FIG. 4 shows a particularly effective embodiment of the invention. The semiconductor component 21 contains a chip 22 which tapers in the rearward direction, toward the base, the longitudinal direction being in the form of a Y. In the case of this arrangement, in which the side walls of the chip may also be positioned obliquely such that they taper conically to a point in a uniform manner, considerably more light is coupled out of the chip than in the case of rectangular side walls as in FIG. 1. This is shown clearly by the radiation characteristics of the chip which are illustrated in FIG. 5. Accordingly, the main radiation is at an angle between approximately 120 and 240°. In order for this light to be utilized effectively in the reflector 23, the chip 22, in relation to the reflector contour 24, which is elliptical, is arranged in the vicinity of a focal point. In order to achieve this, the chip 22 is seated on a platform 25 which is an integral constituent part of the reflector 23. The contact surface 26 of the platform is approximately 20% larger than the base surface 27 of the chip. The side walls 28 of the platform are beveled slightly, which simplifies the production of the platform by milling. The chip is connected to the platform once again via an adhesive 29.

The reflector 23 is seated on a base part 30 (these two may also be formed in one piece). The electrical contacts have been left out here for the sake of simplicity. The housing, furthermore, is completed by side parts 31 which enclose the reflector 23. Introduced in the cutout 35 of the reflector, and above the same, is a covering 32 which is made of casting resin and of which the central part is designed as a lens 33. Interaction of all these components makes it possible to achieve optimal radiation characteristics with a very high luminous flux which is distributed very uniformly over the reflector opening.

What is claimed is:

1. A reflector-containing semiconductor component, comprising:
    a housing that includes first and second electrical connectors, and a reflector, wherein the reflector is shaped to have a vertex and an opening;
    a platform secured in the vertex of said reflector; and
    at least one radiation emitting LED fastened on said platform and spaced from said reflector;
    wherein said platform is sized such that said LED is spaced by said platform from said reflector so as to optimize the radiation emitted from said LED directed toward said opening in the reflector.

2. The semiconductor component as claimed in claim 1, wherein the at least one LED is integrated in a chip which has in each case a rectangular base surface and top surface, the top surface being oriented in the direction of the opening of the reflector.

3. The semiconductor component as claimed in claim 2, wherein the area of the base surface of the at least one LED is smaller than that of the top surface of the at least one LED.

4. The semiconductor component as claimed in claim 2, wherein the contact surface of the platform corresponds approximately to the base surface of the chip, the two surfaces differing in size, at most, by not more than 30%.

5. The semiconductor component as claimed in claim 1, characterized in that a region around the vertex is designed as a separate underlying surface (referred to as a vertex component (10)), in particular without a reflector contour, the underlying surface being formed in particular by a housing part.

6. The semiconductor component as claimed in claim 5, wherein the at least one LED is integrated in a chip having a rectangular base surface and top surface, the top surface being oriented in the direction of the opening of the reflector, said semiconductor component further comprising an adhesive fastening the platform as a separate component on the underlying surface, the adhesive covering not more than a third of the height of the chip.

7. The semiconductor component as claimed in claim 1, wherein the housing comprises a base part on which the at least one LED is fastened directly or indirectly.

8. The semiconductor component as claimed in claim 1, wherein the platform is one of a separate component and an integral constituent part of the housing.

9. The semiconductor component as claimed in claim 8, wherein the platform comprises material which is a good heat conductor.

10. The semiconductor component as claimed in claim 1, wherein the platform is a round or rectangular plate with a height of approximately 100 to 500 $\mu$m.

11. The semiconductor component as claimed in claim 1, further comprising a covering that is fitted over the at least one LED and acts as a lens.

12. The semiconductor component as claimed in claim 1, wherein the reflector has a contour which, at least partially, is similar to the shape of a conic section, a parabola, ellipse or sphere.

13. The semiconductor component as claimed in claim 1, wherein the overall height of the chip is less than or equal to 300 $\mu$m.

* * * * *